March 24, 1964 L. R. PEASLEE 3,126,516
ELECTRONIC SWITCHING CIRCUIT
Filed April 3, 1961
Fig. 1
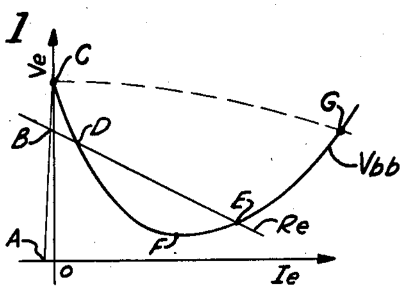
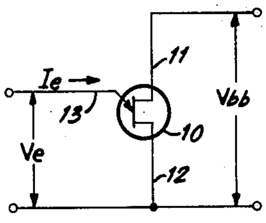
Fig. 2
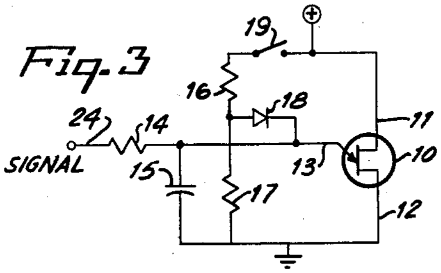
Fig. 3
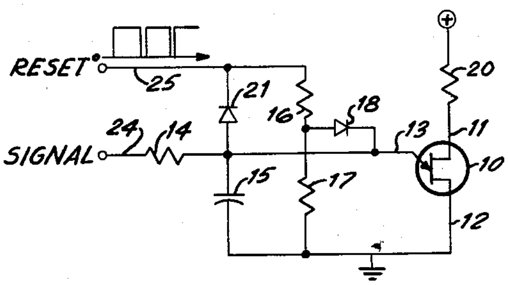
Fig. 4
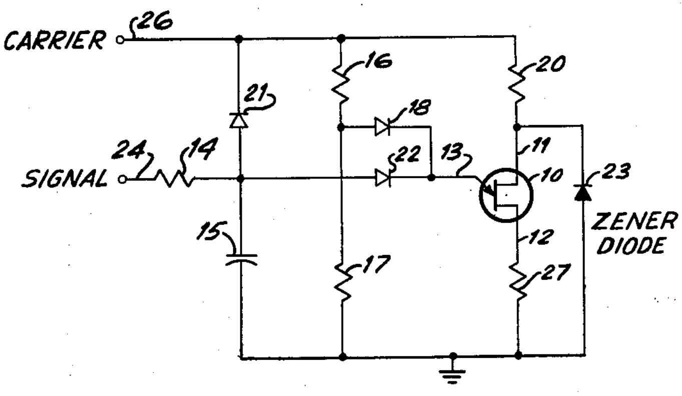
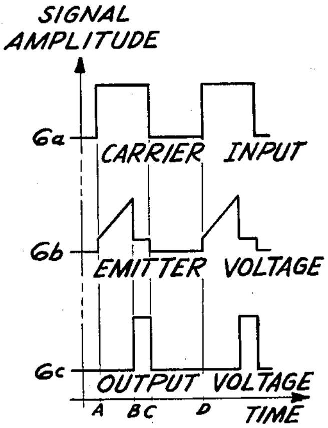
Fig. 5
Fig. 6
INVENTOR.
LAWRENCE ROSWELL PEASLEE
BY
Robert R. Strack
ATTORNEY United States Patent Office 3,126,516
Patented Mar. 24, 1964

3,126,516
ELECTRONIC SWITCHING CIRCUIT

Lawrence R. Peaslee, Waynesboro, Va., assignor to General Electric Company, a corporation of New York Filed Apr. 3, 1961, Ser. No. 100,246
11 Claims. (Cl. 332—9)

This invention relates to electronic switching circuits and particularly to the use of unijunction transistors in electronic switching circuits.

Computers and other electronic equipment require reliable, efficient, and light weight circuits to perform switching, timing, and pulse modulation functions. It is common in such applications to employ hundreds of identical circuits; thus, every component within these circuits which can be eliminated or made more reliable results in considerable economic advantage.

An object of the present invention is to provide an efficient and reliable circuit suitable for applications to switching, timing, and pulse modulation circuitry.

Recently, solid state physics has provided the unijunction transistor; a switching component having bistable characteristics and exhibiting exceptional qualities of reliability, efficiency, and size. A unijunction transistor essentially comprises a small bar of semi-conductive material having two base electrodes and an emitter electrode. The base electrodes make ohmic contact at opposite ends of the bar and the emitter electrode makes a rectifying junction between the ends and closer to one of the base electrodes than to the other. In normal circuit operation the base electrode most distant from the emitter is grounded and a positive bias voltage is applied to the other base electrode. With no emitter current flowing, the semi-conductive bar acts as a voltage divider developing a fraction of the bias voltage at the emitter junction. If voltage is externally applied to the emitter which is less than that developed by the bias voltage, the unijunction transistor will be reverse biased and normally a small emitter leakage current only will flow. If the voltage applied to the emitter is greater than that developed by the bias voltage, the unijunction transistor will be forward biased and heavy emitter current will flow between the emitter and most distant base electrode. The net effect of such current flow is a decrease in the resistance between the emitter and base thereby encouraging increasing emitter current and decreasing emitter voltage. In other words, a negative resistance characteristic is experienced.

Thus, in order to trigger a unijunction transistor into the high current conduction state, a voltage, hereinafter referred to as a triggering voltage, must be applied to the emitter. Prior to conduction, current in the order of microamperes flows and thus the triggering voltage source does not require a high current capacity; however, once triggered, the greatly decreased impedance of the emitter-base path results in a flow of current in the order of milli-amperes.

In order to establish the unijunction transistor in a stable high current conduction state, a suitable current source must supply the emitter-base path. Once triggered, a relatively large current is also needed to return a unijunction transistor to its stable nonconducting state. In view of these facts, the ideal driving source would have the features of low impedance and high current capacity. In many applications, this type of source is not available and, therefore, it is necessary to devise means for the use of unijunction transistors in conjunction with high impedance signal sources.

Another object of this invention is to provide improved unijunction transistor circuits operable in conjunction with high impedance signal sources.

Still another object is to provide improved unijunction transistor circuits for switching, timing, and pulse modulation applications.

Basically, the invention comprises energy storage means interposed between a high impedance signal source and the emitter of a unijunction transistor. The energy storage means is effective to store energy until the triggering voltage of the unijunction transistor is reached, at which time it supplies current to the low impedance emitter-base path. Additional means is provided operative upon discharge of the energy storage means, to act as a current source in order to maintain conduction in the emitter-base path. In one embodiment of the invention a reset circuit is provided to enable the switching circuit to reside in the state indicated by a control signal and thereby provide a positive condition easily used to control additional equipment. Another embodiment illustrates a basic switching circuit in conjunction with a pulse source to develop output pulses which are duration modulated in accordance with the voltage magnitude of an input signal.

The features of the invention which are believed to be novel are set forth with particularity in the appended claims. The invention itself, however, both as to its organization and method of operation, together with further objects and features thereof, may best be understood by reference to the following description taken in conjunction with the accompanying drawing wherein:

FIG. 1 shows a typical emitter characteristic curve of a unijunction transistor;

FIG. 2 is a circuit schematic illustrating the notations used in identifying various voltages and currents associated with a unijunction transistor;

FIG. 3 is a schematic drawing of the basic unijunction transistor switch contemplated herein;

FIG. 4 is a schematic drawing of an illustrative embodiment of the invention wherein automatic reset means are provided to yield a unijunction transistor circuit, the state of which represents the nature of a particular input signal;

FIG. 5 is a schematic drawing of another illustrative embodiment of the invention wherein means are provided to yield a unijunction transistor circuit for performing either timing or pulse duration modulating functions; and FIG. 6 illustrates the waveforms present at particular points in the circuitry of FIG. 5.

The general operating characteristics of a typical unijunction transistor may be understood by reference to FIGS. 1 and 2. FIG. 2 is a simple circuit schematic showing the notations used in the emitter characteristic curve of FIG. 1. In FIG. 2, unijunction transistor 10 is composed of bases 11 and 12 and emitter electrode 13. As illustrated, the unijunction transistor has a semi-conductive body of the N-type and a P-N emitter junction. It is understood that a reversal of these semi-conductive types can be made without requiring inventive ingenuity or detracting from the unique aspects of the circuits disclosed.

In operation, a bias voltage $V_{bb}$ is applied between bases 11 and 12 and a second voltage $V_e$ is applied between emitter 13 and base 12. When the voltage $V_e$ exceeds the triggering potential, current $I_e$ flows between emitter 13 and base 12. The characteristic curve in FIG. 1 is generated by plotting the emitter voltage, $V_e$, as a function of the emitter current, $I_e$. The curve represents the operating characteristics when a particular voltage $V_{bb}$ is applied between bases 11 and 12. Load line $R_e$ has three intersections with the emitter characteristic curve; namely, B, D, and E. It is known that between triggering point C and knee F the unijunction transistor is working in an unstable, negative resistance region and consequently it will not stabilize at point D.

Two stable states exist, those depicted as points B and E. In the first of these states, the B state, negligible current flows and this state is therefore characteristically known as the nonconducting state. As the emitter voltage is increased there is a minimal change in emitter current, in the order of microamperes, until the peak or triggering voltage is attained at point C. This level has previously been described as being that fraction of voltage $V_{bb}$ determined by the particular junction point on the semi-conductive material at which the emitter electrode is placed. Upon reaching triggering potential, emitter current flows between emitter 13 and base 12 lowering the impedance therebetween, thereby encouraging still further increase in emitter current with cumulative effect until point F on the emitter characteristic curve is attained. At this point, increased voltage on the emitter causes the current to increase to point E and a stable conducting condition is achieved. The conduction state of unijunction transistor 10 may be detected by monitoring the voltage across an impedance carrying current $I_e$, by detecting the variation in current flow from base 12 to ground, or by any other suitable means.

Several important points are to be noted in connection with the above operation. In order to trigger the unijunction transistor "on," a peak voltage must be supplied, although this voltage need only be supported by a current supplying capacity of microampere magnitude. Once conduction has started, however, the current rapidly builds up to milli-ampere magnitude and the signal source must be able to supply such a current in order to maintain conduction in a stable mode. It should be noted that in order to interrupt conduction, i.e. to bring operation below point F on the emitter characteristic curve, a large current capacity is required.

Specific embodiments of the instant invention are illustrated in FIGS. 3, 4, and 5. Inasmuch as succeeding figures are modifications of their predecessors, where elements therein perform the same functions they are designated by the same descriptive numerals.

FIG. 3 is a circuit schematic of a basic form of the invention. A signal is applied to terminal 24 having a minimum voltage capability of attaining the peak voltage required to trigger unijunction transistor 10 to the conducting state. A resistor 14 is interposed between terminal 24 and emitter 13, and capacitor 15 is connected between ground and the junction of resistor 14 and emitter 13. Resistor 14 represents either the driving source impedance, or the resistive component of a timing circuit if the source has a negligible impedance. Bias voltage is supplied by a positive potential connected across base electrodes 11 and 12. For convenience, in the following description, ground is considered as one terminal of all sources and potentials; of course, other arrangements are within the scope of the invention. A voltage divider comprising resistors 16 and 17 is connected between the positive potential and ground, being separated from the positive potential by switch 19. Diode 18, polarized to conduct current to emitter electrode 13, is connected between emitter 13 and the junction of resistors 16 and 17.

For purpose of discussion assume that switch 19 is closed. This applies a voltage to emitter 13 having a magnitude determined by the values of resistors 16 and 17. The magnitude is adjusted to be below the triggering potential and yet above that required to sustain conduction in unijunction transistor 10 once it has been established. When a signal is applied between terminal 24 and ground it is effective to charge capacitor 15 in the circuit comprising resistor 14 and capacitor 15 in series. The voltage at the junction of resistors 14 and capacitor 15 rises in an exponential curve with a time constant determined by the magnitudes of resistor 14 and capacitor 15. When the voltage at the junction of resistor 14 and capacitor 15 reaches the triggering potential of unijunction transistor 10, current begins to flow between emitter 13 and base 12. The effect of this current flow provides a low impedance discharge path for capacitor 15. Because the voltage on capacitor 15 cannot change instantaneously, as the capacitor discharges in the circuit path comprising emitter 13 and base 12 the voltage traverses the dotted curve CG illustrated in FIG. 1. At point G, the transistor characteristic curve having been intercepted, the circuit reaches stability by traversing the curve from point G to point E. Of course, the amount of voltage drop on capacitor 15 before the transistor curve is intersected is directly related to the magnitude of the capacitor. When the voltage on capacitor 15 descends below the level of the voltage appearing at the junction of resistors 16 and 17, diode 18 becomes conductive and the subsequent current is supplied by the circuit comprising positive potential, switch 19, resistor 16, and diode 18. The potential applied by the voltage divider, resistors 16 and 17, is arranged to be slightly below the triggering potential of the unijunction transistor used so that the current is clamped at E. It is thus seen that negligible current is required from the signal source since the capacitor supplies the switching current. In order to stop conduction of unijunction transistor 10, switch 19 is opened to cut off the sustaining current supplied therethrough.

In the circuit of FIG. 3, once unijunction transistor 10 is in the conducting state further changes in the signal applied at terminal 24 are not reflected by changes in the conduction state until the circuit is manually reset by opening switch 19.

The circuit schematic of FIG. 4 illustrates one means whereby the state of unijunction transistor 10 may be be made indicative of the signal present on terminal 24. By applying a voltage to terminal 25, having a magnitude sufficient to maintain unijunction transistor 10 in the conducting state only if initially conducting and having a duration in excess of the time required to charge capacitor 15 to the triggering voltage level, unijunction transistor 10 will be conducting essentially continuously whenever the signal on terminal 24 is above the triggering potential and off whenever it is below the triggering potential. The reset signal applied to terminal 25 may be a series of positive pulses having a long duty cycle, or in other words having a short interpulse period with respect to the pulse width. The period between pulses is effective to reset the circuit, while during the pulses the circuit resides in a state indicative of the presence or absence of a signal on terminal 24.

The circuit of FIG. 4 differs from that of FIG. 3 by the inclusion of diode 21 and by supplying the voltage divider with the reset signal applied to terminal 25. Several differences in operation result from this modified circuit configuration. During the interpulse period, the cathode of diode 21 is essentially at zero potential and, therefore, diode 21 provides a short circuit to ground for any energy stored in capacitor 15. At this time the voltage on emitter 13 goes to zero and unijunction transistor 10 is cut off. Upon application of the next pulse to terminal 25, diode 21 is reverse-biased and capacitor 15 begins to charge under the control of the signal applied to terminal 24. During the presence of pulses on terminal 25, the circuit operates in the manner previously considered in conjunction with FIG. 3.

A resistor 20 is illustrated as connected in series with the biasing voltage and base electrodes 11 and 12 in FIG. 4. The function of resistor 20 is to limit the current flowing between base electrodes 11 and 12 and thereby protect unijunction transistor 10. This resistor is only necessary when the biasing voltage exceeds levels specified for various types of unijunction transistors. Resistor 20 may also be used to serve as a temperature compensating element to keep the trigger voltage constant under varying temperatures. In fact, however, under many operating conditions resistor 20 may be of negligible magnitude.

The switching circuit of this invention has also been embodied in the timing circuit illustrated by the circuit schematic of FIG. 5. In this embodiment of the invention, if pulses are applied to terminal 26 they are duration modulated in accordance with the magnitude of voltages applied to terminal 24. FIG. 5 differs from its predecessors in the nature of the signals applied to the various terminals, by the addition of diode 22, and by the addition of Zener diode 23. The effect of each of these changes will be apparent from a detailed consideration of circuit operation.

A train of pulses of fixed duration is applied to terminal 26. These pulses are illustrated in FIG. 6*a* and have an amplitude sufficient to sustain conduction in unijunction transistor 10 once it has been initiated. A modulating signal is applied to terminal 24 having a minimum amplitude in excess of the threshold voltage of unijunction transistor 10.

Upon application of a pulse train to terminal 26, such as illustrated in FIG. 6*a*, at time A a positive voltage is applied through resistor 20 to base 11 of unijunction transistor 10. Simultaneously, positive voltage is applied across resistors 16 and 17 in series, creating a voltage at the anode of diode 18 which is applied to emitter 13. This positive voltage also back-biases diode 21 permitting the signal voltage on terminal 24 to charge capacitor 15 through resistor 14. Diode 22 is interposed between emitter 13 and the junction of resistor 14 and capacitor 15 and is polarized to pass current from terminal 24 to emitter 13. When the voltage on emitter 13 reaches triggering potential, conduction takes place and current flows between emitter 13 and base 12. As previously discussed, this current initially is supplied by the discharge of capacitor 15. However, when the voltage of capacitor 15 descends below that established at the junction of resistors 16 and 17, diode 18 becomes conductive and the current is thereafter supplied by the series of input pulses appearing at terminal 26.

FIG. 6*b* illustrates the voltage waveform appearing on emitter electrode 13. At time A there is a sharp increase in voltage due to the application of a pulse to terminal 26 which creates a voltage at the junction of resistors 16 and 17, this voltage being applied through diode 18 to emitter electrode 13. Assuming a voltage signal is being applied to terminal 24, the capacitor 15 is charged and the voltage appearing thereon is passed by diode 22 and applied to emitter electrode 13 during the period A to B.

At time B the triggering potential is reached, conduction commences in unijunction transistor 10, and the voltage appearing on the emitter consequently rapidly drops to the value maintained by the voltage drop appearing across resistor 16. The emitter voltage remains at this relatively low value between time B and time C. While unijunction transistor 10 is fully conducting, current is flowing in the path from terminal 26 through resistor 16, diode 18, emitter electrode 13, base electrode 12, and load resistor 27, to ground. This current is essentially of a square waveform and consequently the voltage appearing across resistor 27 is essentially a square wave. Such a voltage is illustrated in FIG. 6*c*.

At time C, the pulse applied to terminal 26 is terminated and unijunction transistor 26 is cut off. Any charge remaining on capacitor 15 is shunted to ground via diode 21. At this time, therefore, the emitter voltage drops to zero and likewise the voltage across resistor 27.

It will be recalled that capacitor 15 charges in an exponential fashion toward the level of the signal voltage applied to terminal 24 with a time constant determined by the magnitudes of resistor 14 and capacitor 15. Since this is the case, the time at which capacitor 15 attains the triggering voltage is determined by the magnitude of the input signal. This in turn indicates that the time between energization of unijunction transistor 10 and the conduction thereof is proportional to the magnitude of the voltage applied to terminal 24. Thus, the duration of the output pulse appearing across resistor 27 is directly related to the magnitude of the voltage signal applied to terminal 24. The linearity of this relationship is dependent upon the portion of the charging curve traversed before attaining the triggering voltage.

It should be noted that diode 22 is required to permit capacitor 15 to commence charging from zero when a signal is applied to both terminal 26 and terminal 24. In the absence of diode 22, the junction between resistors 14 and capacitor 15 would be clamped by diode 18 to the voltage level established by the voltage divider composed of resistors 16 and 17.

In order to use the timing function of FIG. 5 without regard to pulse modulation, the carrier applied to terminal 26 may be a direct current of voltage magnitude below the triggering potential and above the sustaining potential. With such a constant supply on terminal 26, the appearance of an output signal is indicative of the passage of a predetermined period of time, the period of time being determined by the RC time constant developed by resistor 14 and capacitor 15.

For a long period timer, the voltage on capacitor 15 will drop very little following breakdown of unijunction transistor 10. In other words, curve CG in FIG. 1 will drop very slightly from the triggering potential. This may result in excessive current unless a resistor is inserted between capacitor 15 and diode 22.

As hereinbefore mentioned, the triggering voltage required to trigger unijunction transistor 10 to a current conducting state is a certain percentage of the voltage applied between base 11 and base 12. The level of these voltages is reasonably constant over a wide temperature range; however, in order to limit the dissipation in the unijunction transistor, resistor 20 may be inserted in series with the energization path of the bases. Unless such a current limiting resistor exhibits the same temperature co-efficient as the unijunction transistor, the voltage applied across the transistor will vary with temperature. In order to overcome the unreliability inherent in such variations, a Zener, or reference, diode 23 is inserted across transistor 10. When the transistor is not conducting diode 23 maintains a constant voltage at base electrode 11 regardless of temperature. When unijunction transistor 10 is driven to conduction, the current between base 11 and base 12 increases and consequently the voltage on base 11 decreases below the breakdown point of diode 23 and it becomes nonconductive, thereby effectively removing it from the circuit.

While there has been shown particular embodiments of this invention, it will, of course, be understood that it is not wished to be limited thereto since modifications may be made both in the circuit arrangements and in the instrumentalities employed, and it is contemplated in the appended claims to cover any such modifications as fall within the true spirit and scope of the invention.

What is claimed as new and desired to be secured by Letters Patent of the United States is:

1. In combination, a unijunction transistor comprising two base electrodes and an emitter, a load resistor connected between one of said base electrodes and a point of reference potential, means to supply pulses positive with respect to said point and of fixed duration to the other of said base electrodes, and control means to modulate in accord with a desired control voltage the duration of said pulses as they appear on said resistance, said control means comprising means to vary in accord with said control voltage the time in each of said first pulses when said unijunction transistor becomes conductive between its emitter and said one base electrode.

2. In combustion, a unijunction transistor having two base electrodes and an emitter electrode, a resistance connected between one of said base electrodes and a point of reference potential, means to supply pulses positive with respect to said point to the other of said base electrodes and to said emitter, said pulses being supplied to said emitter with insufficient intensity to cause current to flow in said resistance, a variable voltage source, and means to increase the voltage applied to said emitter during each pulse sufficient to produce conduction between said emitter and said one base electrode at a time after initiation of each pulse varying with the magnitude of said variable control voltage whereby said pulses appear on said resistance with duration varying with said variable control voltage.

3. In a switching circuit, a unijunction transistor having an emitter and base electrode operative to conduct current therebetween upon application of a voltage having at least a predetermined magnitude, a signal source supplying voltages of said predetermined magnitude, energy storage means interposed between said signal source and said emitter connected to apply the voltage appearing thereon between said emitter and said base electrode, said energy storage means discharging through the path between said emitter and said base electrode when the voltage appearing thereon attains said predetermined magnitude, and current supply means connected to said emitter and operative upon discharge of said energy storage means to supply current to maintain said unijunction transistor in a conducting state.

4. A switching circuit comprising switching means operative to conduct current upon application of at least a predetermined voltage thereacross and to thereafter sustain said conduction upon application of a lower magnitude voltage, a voltage source supplying voltages of at least said predetermined value, energy storage means connected between said voltage source and said switching means and operative to discharge through said switching means when the voltage thereon attains said predetermined value, sustaining means supplying sufficient voltage to maintain said switching means in high current conduction once established, and unidirectional current conduction means interconnecting said sustaining means and said switching means effective to supply current thereto when said energy storage means discharge below a preselected voltage level.

5. A circuit comprising in combination, a unijunction transistor having an emitter electrode and a base electrode operative to conduct current between said emitter and said base electrode upon application of a voltage thereto of a particular magnitude and to thereafter sustain said conduction upon application of a voltage of substantially lower magnitude, biasing means of sufficient voltage magnitude connected to said unijunction transistor to sustain conduction between said emitted and said base electrode once established, a source of voltage in excess of said particular magnitude, impedance means interconnecting said source of voltage and said emitter electrode, and energy storage means shunting said emitter and said base electrode operative to discharge through the path between said emitter electrode and said base electrode when the voltage on said emitter electrode exceeds a predetermined value.

6. In a switching circuit, a unijunction transistor having an emitter electrode and first and second base electrodes, voltage supply means connected across said base electrodes establishing a trigger potential which upon application between said emitter electrode and said first base electrode will cause current flow therebetween, a signal source applying voltages of at least said triggering potential to said emitter, a capacitor shunting said emitter and said first base electrode, a voltage divider shunting said first and second base electrodes for providing a voltage that is fractionally related to the voltage of said supply means, and a unidirectional current conducting device connected to conduct current from said voltage divider to said emitter electrode when the emitter voltage is below said fractional voltage.

7. A bistable circuit comprising a unijunction transistor having an emitter electrode and two base electrodes operative to conduct current between said emitter and one said base electrode upon application of a voltage of predetermined magnitude therebetween and to thereafter sustain said conduction upon application of a voltage of substantially lower magnitude, drive means connected to said emitter for periodically applying a voltage of at least said lower magnitude thereto, a source of voltage in excess of said predetermined magnitude connected to said emitter electrode, energy storage means shunting said emitter and said one base electrode operative to discharge through the path between said emitter and said one base electrode when the voltage thereon exceeds said predetermined magnitude, and unidirectional current conducting means interconnecting said drive means and said energy storage means poled to discharge said energy storage means during the period no voltage is being applied.

8. A bistable circuit as defined by claim 7 wherein said drive means is connected to said emitter by a unidirectional current conducting means poled to conduct current to said emitter when the voltage thereat is below the voltage of said drive means.

9. A circuit comprising in combination, switching means operative to conduct current upon application of at least a predetermined voltage thereacross and to thereafter sustain said conduction upon application of a lower magnitude voltage, a source of voltage having a magnitude in excess of said predetermined voltage, impedance means and unidirectional current conducting means serially connecting said source of voltage and said switching means, said unidirectional current conducting means polarized to conduct current to said switching means, energy storage means connected in parallel with said unidirectional current conducting means and said switching means, and means for applying a voltage of said lower magnitude to said switching means.

10. A modulator comprising a unijunction transistor having an emitter electrode and two base electrodes operative to conduct current between said emitter and one said base upon application of a voltage of predetermined magnitude therebetween and to thereafter sustain said conduction upon application of a voltage of substantially lower magnitude, a source of pulses, means for applying said pulses across said base electrodes, voltage divider means connected to said source of pulses, unidirectional current conducting means connecting a fraction of the voltage appearing across said voltage divider means to said emitter, a source of voltage signals having magnitudes in excess of said predetermined magnitude, energy storage means connected to said voltage signals and charged thereby at a rate determined by the magnitude of said signals, unidirectional current conducting means interconnecting said energy storage means and said emitter polarized to discharge said energy storage means through the path between said emitter and said one base electrode when the voltage thereof attains said predetermined magnitude, and means in series with the path between said emitter and said one base electrode responsive to the current therein to yield pulses having a duration relative to the magnitude of said voltage signals.

11. A modulator as defined in claim 10 in combination with additional unidirectional current conducting means between said source of pulses and said energy storage means polarized to discharge said energy storage means between said pulses.

References Cited in the file of this patent

UNITED STATES PATENTS

| | | |
|---|---|---|
| 2,820,152 | Mathis et al. | Jan. 14, 1958 |
| 2,826,696 | Suran | Mar. 11, 1958 |
| 2,877,359 | Ross | Mar. 10, 1959 |
| 3,026,425 | Anderson | Mar. 20, 1962 |
| 3,060,388 | Ball et al. | Oct. 23, 1962 |
| 3,078,391 | Bunodiere et al. | Feb. 19, 1963 |

UNITED STATES PATENT OFFICE

CERTIFICATE OF CORRECTION

Patent No. 3,126,516 March 24, 1964

Lawrence R. Peaslee

It is hereby certified that error appears in the above numbered patent requiring correction and that the said Letters Patent should read as corrected below.

Column 6, line 71, for "combustion" read -- combination --; column 7, line 50, for "emitted" read -- emitter --.

Signed and sealed this 28th day of July 1964.

(SEAL)

Attest:

ESTON G. JOHNSON
Attesting Officer

EDWARD J. BRENNER
Commissioner of Patents